(12) United States Patent
Ding et al.

(10) Patent No.: US 8,413,098 B2
(45) Date of Patent: Apr. 2, 2013

(54) T-CONNECTIONS, METHODOLOGY FOR DESIGNING T-CONNECTIONS, AND COMPACT MODELING OF T-CONNECTIONS

(75) Inventors: Hanyi Ding, Essex Junction, VT (US); Essam Mina, Essex Junction, VT (US); Guoan Wang, Essex Junction, VT (US); Wayne Harvey Woods, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 530 days.

(21) Appl. No.: 12/431,887

(22) Filed: Apr. 29, 2009

(65) Prior Publication Data
US 2010/0276809 A1 Nov. 4, 2010

(51) Int. Cl.
*G06F 17/50* (2006.01)
(52) U.S. Cl. .................... 716/126; 716/110; 716/119
(58) Field of Classification Search .............. 716/126
See application file for complete search history.

(56) References Cited

U.S. PATENT DOCUMENTS

2002/0104063 A1* 8/2002 Chang et al. ............... 716/4

OTHER PUBLICATIONS

Edwards, T.C; Steer, M.B.; "Discontinuities in Microstrip and Stripline," 2000, Foundations of Interconnect and Microstrip Design, John Wiley & Sons.*
Agilent Technologies, "Distributed Components," Sep. 2006, Advanced Design System Documentation 2006A.*
Guan, Boran; Wengler, Michael; Rott, Pavel; Feldman, Marc; "The Inductance Estimation for Complicated Superconducting Thin Film Structures with a Finite Segment Method," Aug. 25, 1996, University of Rochester.*
Branner, G.R; Kumar, B Preetham; Thomas Jr., Donald G.; "Design of Microstrip T Junction Power Divider Circuits for Enhanced Performance," 1996, IEEE.*
Wolf, Stanley, "Introduction to Dual-Damascene Interconnect Processes," 2004, Lattice Press, <http://www.latticepress.com/damascene.html>.*
Silvester and Benedek; Microstrip Discontinuity Capacitances for Right-Angle Bends, T Junctions, and Crossings; IEEE Transactions on Microwave Theory and Techniques, vol. MTT-21, No. 5, May 1973; pp. 341-346.
Farrar and Adams; Matrix Methods for Microstrip Three-Dimensional Problems; IEEE Transactions on Microwave Theory and Techniques, vol. MTT-20, No. 8, Aug. 1972; pp. 497-504.
Ding et al; Modeling and Implementation of On-Chip Millimeter-Wave Compact Branch Line Couplers in a BiCMOS Technology; Proceedings of the 37 European Microwave Conference, Oct. 2007, Munich, Germany; pp. 458-461.

*Primary Examiner* — Vuthe Siek
*Assistant Examiner* — Eric Lee
(74) *Attorney, Agent, or Firm* — Schmeiser, Olsen & Watts; Richard Kotulak

(57) ABSTRACT

T-connections, methodology for designing T-connections, and compact modeling of T-connections. The T-connections include an electrically conductive T-junction comprising a body and first, second and third integral arms projecting from mutually perpendicular sides of the body, each arm of the three integral arms having a same first width abutting the body and a same length extending away from the body; an electrically conductive step-junction comprising a first section having the first width and an integral and abutting second section having a second width, the second width different from the first width, the first section smoothly abutting and integral with the first arm of the T-junction; and wherein top surfaces of the T-junction and the step-junction are coplanar.

25 Claims, 8 Drawing Sheets

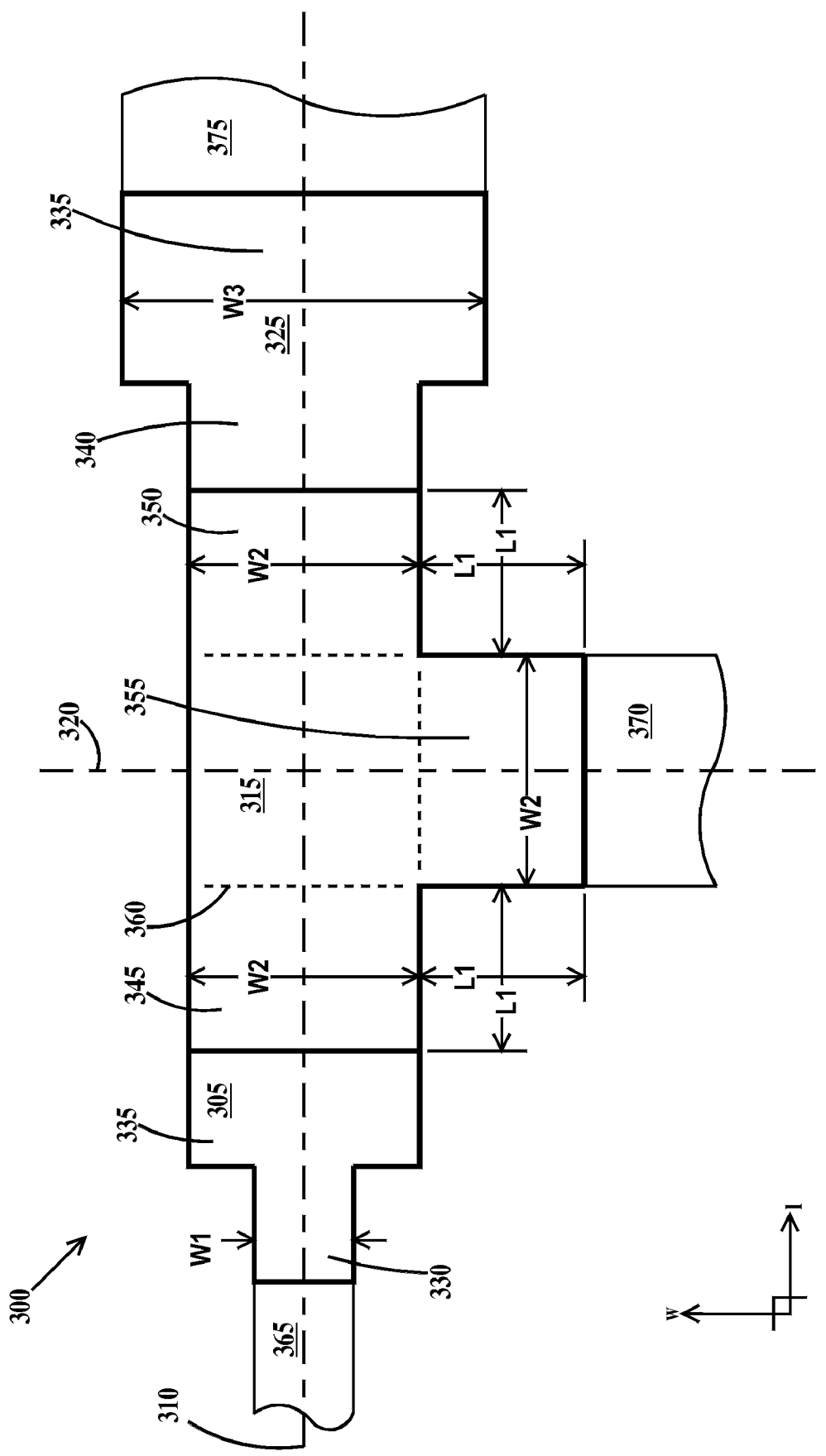

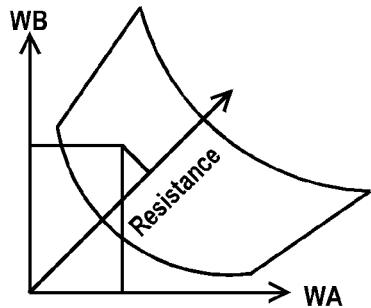
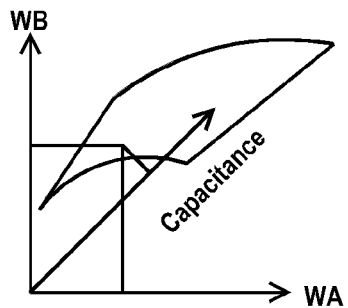
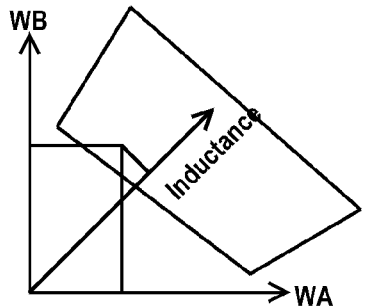
*FIG. 12A*  *FIG. 12B*  *FIG. 12C*
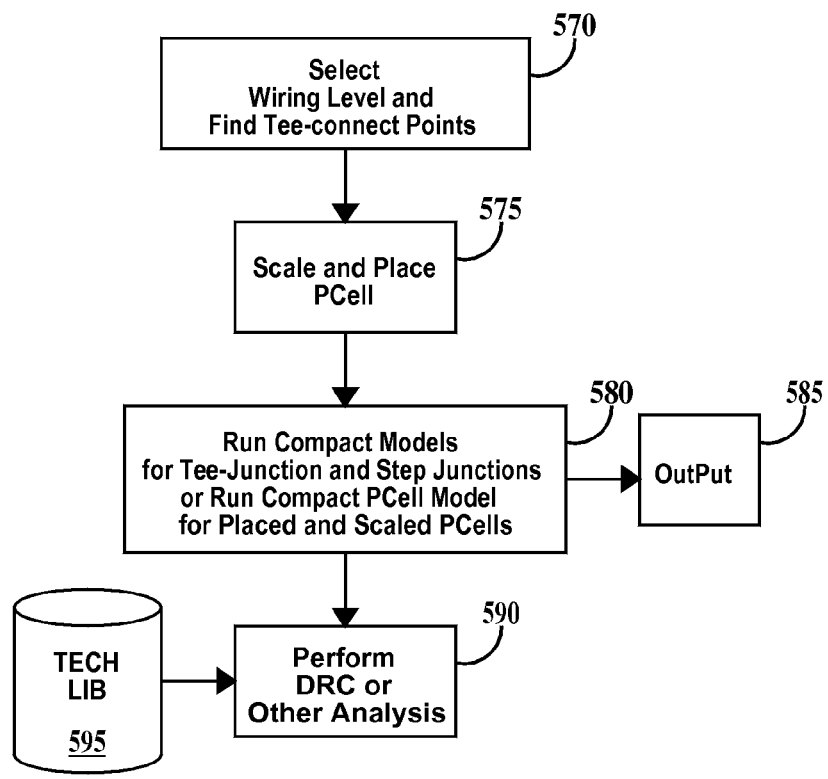
*FIG. 13*

T-CONNECTIONS, METHODOLOGY FOR DESIGNING T-CONNECTIONS, AND COMPACT MODELING OF T-CONNECTIONS

FIELD OF THE INVENTION

The present invention relates to the field of integrated circuits; more specifically, it relates to T-junctions, T-junction library elements, methodology for designing T-junctions and compact modeling of T-junctions.

BACKGROUND OF THE INVENTION

T-junctions are widely used to interconnect three wires in wiring levels of integrated circuits. At high frequencies T-junctions must be modeled in order to simulate layout parasitics as part of the performance check of the circuit. Not only are these simulations complex and time-consuming, but also the models generated are not scalable so the process must be repeated as layout groundrules by level or technology change. Accordingly, there exists a need in the art to mitigate the deficiencies and limitations described hereinabove.

SUMMARY OF THE INVENTION

A first aspect of the present invention is a T-connection, comprising: inputting a layout of the T-connection consisting of a T-junction having arms of a first width and a first length and one or two step-junctions having respective first sections of the first width and respective second sections of respective second widths, the second widths different from each other and from the first width; calculating, using a first compact model of the T-junction running on the processor, one or more of parasitic resistance, parasitic inductance and parasitic capacitance of the T-junction based on the first length and the first width; calculating, using a second compact model of the one or two step-junctions running on the processor, one or more of parasitic resistance, parasitic inductance and parasitic capacitance of the step-junctions based on the first width and the second widths; and either outputting results of the first and second compact models or inputting the results of the first and second compact models to a performance analysis program.

A second aspect of the present invention a method of modeling a T-connection, comprising: inputting a layout of the T-connection consisting of a T-junction having arms of a first width and a first length and one or two step-junctions having respective first sections of the first width and respective second sections of respective second widths, the second widths different from each other and from the first width; calculating, using a first compact model of the T-junction running on the processor, one or more of parasitic resistance, parasitic inductance and parasitic capacitance of the T-junction based on the first length and the first width; calculating, using a second compact model of the one or two step-junctions running on the processor, one or more of parasitic resistance, parasitic inductance and parasitic capacitance of the step-junctions based on the first width and the second widths; and either outputting results of the first and second compact models or inputting the results of the first and second compact models to a performance analysis program.

A third aspect of the present invention is a method of designing an integrated circuit, comprising: (a) selecting a wiring layer of an integrated circuit; (b) selecting, using a processor of a computer, a set of three wires to connect using a T-connection PCell, at least two of the wires having different widths, the T-connection PCell consisting of a T-junction having arms of a first width and a first length one or two step-junctions having respective first sections of the first width and respective second sections of respective second widths, the second widths different from each other and from the first width; (c) selecting, using the processor, the first width to be a width of a first wire of the three wires and selecting the second section widths to be equal to widths of respective second and third wires of the three wires; (d) placing, using the processor, the T-connection PCell on a layout of the wiring level to interconnect the three wires; and (e) outputting the layout.

A fourth aspect of the present invention is a computer system comprising a processor, an address/data bus coupled to the processor, and a computer-readable memory unit coupled to communicate with the processor, the memory unit containing instructions that when executed by the processor implement a method for designing an integrated circuit, the method comprising the computer implemented steps of: (a) selecting a wiring layer of an integrated circuit; (b) selecting a set of three wires to connect using a T-connection PCell, at least two of the wires having different widths, the T-connection PCell consisting of a T-junction having arms of a first width and a first length and one or two step-junctions having first sections of the first width and second sections of respective second widths, the second widths different from each other and from the first width; (c) selecting the first width to be a width of a first wire of the three wires and selecting the second section widths to be equal to widths of respective second and third wires of the three wires; (d) placing the T-connection PCell on a layout of the wiring level to interconnect the three wires; and (e) outputting the layout.

These and other aspects of the invention are described below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 5 is a layout view of an exemplary T-connection according to the embodiments of the present invention;

FIG. 12A is plot of resistance, FIG. 12B is plot of capacitance and FIG. 12C is a plot of inductance vs. the two widths of the two sections of the step-junction from the field solver in step 520 of FIG. 9;

FIG. 13, is a flowchart of a design flow utilizing the scalable T-junction according to the embodiments of the present invention.

DETAILED DESCRIPTION OF THE INVENTION

Figure 1:
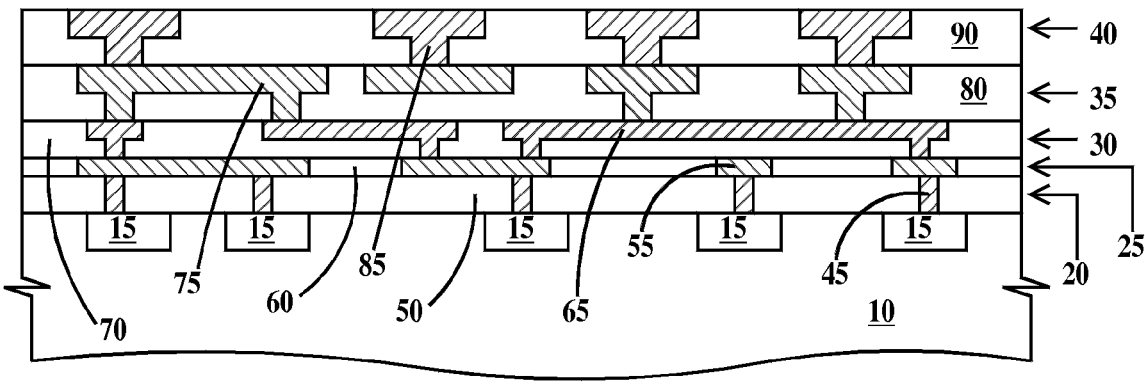
FIG. 1 is cross sectional view through an exemplary integrated circuit chip.

T-interconnects according to the present invention comprise integrally formed T-junctions and step-junctions that smoothly abut the arms of the T-junction that are used to form three wire junctions. Compact models are used to generate parameterized cells that allow placement of three-wire junctions into wiring levels of an integrated circuit design. The design may then b used to form, for example, three damascene wire junctions in actual integrated circuit chips. The following definitions will aid in understanding the embodiments of the present invention.

A single-damascene wire is a wire formed by a single-damascene process. A dual-damascene wire is a wire formed by a dual-damascene process. When viewed in a cross-section that does not include a via (see infra), the cross-section of a dual-damascene wire is similar to the cross-section of a single-damascene wire.

A single-damascene process is one in which wire trenches or via openings are formed in a dielectric layer, an electrical conductor of sufficient thickness to fill the trenches is deposited in the trenches and on a top surface of the dielectric, and a chemical-mechanical-polish (CMP) process is performed to remove excess conductor and make the surface of the conductor co-planar with the surface of the dielectric layer to form damascene wires (or damascene vias).

A via first dual-damascene process is one in which via openings are formed through the entire thickness of a dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

Hereinafter, the term "damascene wire" is intended to include both single-damascene and dual damascene wires.

In a first sense, a compact model is a device model that is Compact Model Council compliant. An example of a compact model is the Berkeley Short-channel IGFET Model (BSIM4) that is compatible with a circuit simulator such as PowerSPICE, developed by IBM Corporation, Hspice, available from Synopsys, Inc., San Jose, Calif., and/or the Cadence Spectre Circuit Simulator, available from Cadence Design Systems, Inc., San Jose, Calif. BSIM. Another example is BSIMPD, which is a compact model for Silicon-on-insulator (SOI) devices. Both compact models are publicly available from the University of California, Berkeley where "PD" denotes "partially-depleted." In a second sense, a compact model is an approximate analytic model that describes the physics of complex 3-dimensional phenomenon in a less complex 2-dimensional description (embodied in an equation, model or algorithm) and in a form that is more easily encoded in software and less computer time intensive, but gives substantially the same results as the exact solution to the complex phenomenon. The term "compact model" is used herein in both senses.

Smoothly abutting is defined as the abutting of two elements wherein the abutting sides of the two elements are of a same width and are coextensive. There are no jogs and no region of either abutting side is exposed. In two-dimensional layout view representations of three-dimensional elements, the abutting sides are lines.

A paramaterizeed cell (Pcell) is a "cell" which is automatically generated by electronic design automation (EDA) software based on the value of its governing parameters. Hence, a PCell represents a part or a component of the circuit that is dependent on one or more parameters and is not a fixed element. Underlying characteristics of all PCells are: (1) dependence on (input) parameters and (2) ability to generate design data based on the latter parameters. Hence, a PCell is a piece of programming code. This code is responsible for the process of creating the proper structure of the PCell variants based on its (input) parameters. For the example of a Physical (layout) PCell, this code generates (draws) the actual shapes of the (mask design data) that comprise the circuit.

Electromagnetic field solvers (or field solvers) are specialized programs that solve (a subset of) Maxwell's equations directly. They form a part of the field of electronic design automation, and are commonly used in the design of integrated circuits and printed circuit boards. They may be used to solve for parasitic values of resitance, capacitance and inductance of integrated circuits.

FIG. 1 is cross sectional view through an exemplary integrated circuit chip. In FIG. 1, a semiconductor substrate 10 includes substrate regions 15 of circuit elements. Formed on substrate 10 and regions 15 is a contact level 20. Formed on contact level 20 are, in sequence from contact level 20, first, second, third and fourth wiring levels 25, 30, 35, and 40. Contact level 25 comprises electrically conductive contacts 45 (formed by a single-damascene process) in a contact dielectric layer 50. First wiring level 25 comprises single-damascene wires 55 in a first interlevel dielectric layer 60. Second wiring level 30 comprises dual-damascene wires 65 in a second interlevel dielectric layer 70. Third wiring level 35 comprises dual-damascene wires 75 in a third interlevel dielectric layer 80. Fourth wiring level 40 comprises dual-damascene wires 85 in a fourth interlevel dielectric layer 90.

The circuit elements may include bipolar transistors, field effect transistors, diodes, capacitors, resistors and inductors. Contact dielectric layer 50 and first, second, third, and fourth interlevel dielectric layers 60, 70, 80 and 90 may independently consist of two or more distinct dielectric layers. There may be more or less than the number of wiring levels illustrated in FIG. 1. T-connections according to the embodiments of the present invention may be formed in any one or more of wiring levels 25, 30, 35 and 40. T-connects according to embodiments of the present invention may be included in transmission lines and/or waveguides of integrated circuits.

Figure 2A:
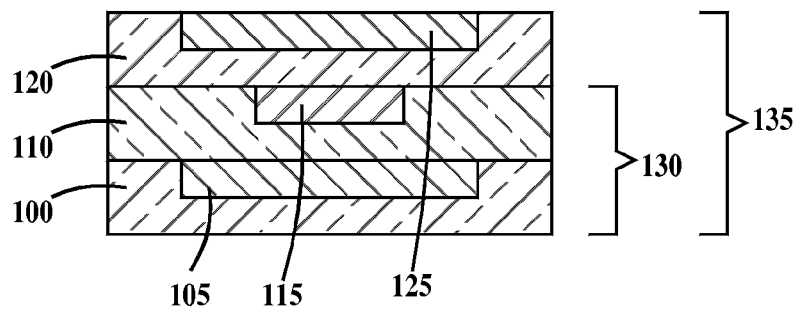
FIG. 2A is an exemplary cross sectional view of a transmission line of an integrated circuit chip.

FIG. 2A is an exemplary cross sectional view of a transmission line of an integrated circuit chip. In FIG. 2A, a lower (closest to a substrate) dielectric layer 100 includes a damascene wire 105, a middle dielectric layer 110 includes a damascene wire 115, and an optional upper dielectric layer 120 includes an optional damascene wire 125. Wire 115 is stacked over wire 105; wire 125 is stacked over wire 115. Wire 115 is separated from wire 105 by a region of second dielectric layer 110. Wire 125 is separated from wire 115 by a region of third dielectric layer 120. In a transmission line, wire 115 carries the signal and wires 105 and 125 (if present) are shields and may be connected to ground. Microstrips and striplines are two forms of transmission lines. In FIG. 2A, a microstrip 130 consists of first and second dielectric layers 100 and 110 and wires 105 and 110. In a microstrip, while third dielectric layer 120 may be present, wire 125 is not. In FIG. 2A, a stripline 135 consists of consists of first, second and third dielectric layers 100, 110 and 120 and wires 105, 115 and 125.

Figure 2B:
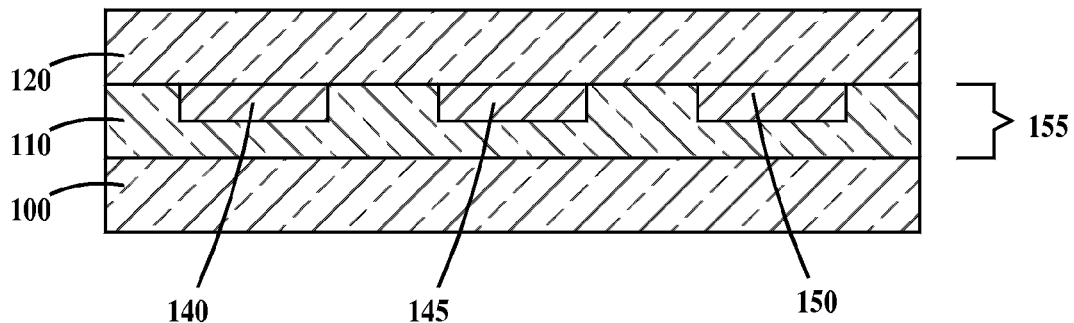
FIG. 2B is an exemplary cross sectional view of a coplanar waveguide of an integrated circuit chip.

FIG. 2B is an exemplary cross sectional view of a coplanar waveguide of an integrated circuit chip. In FIG. 2B, middle dielectric layer 110 includes damascene wires 140, 145 and 150. Wire 145 is separated from wires 140 and 150 by regions of second dielectric layer 110. A waveguide 155 consists of second dielectric layer 110 and wires 140, 145 and 150. In a waveguide, wire 145 carries the signal and wires 140 and 150 are shields and may be connected to ground.

Figure 3:
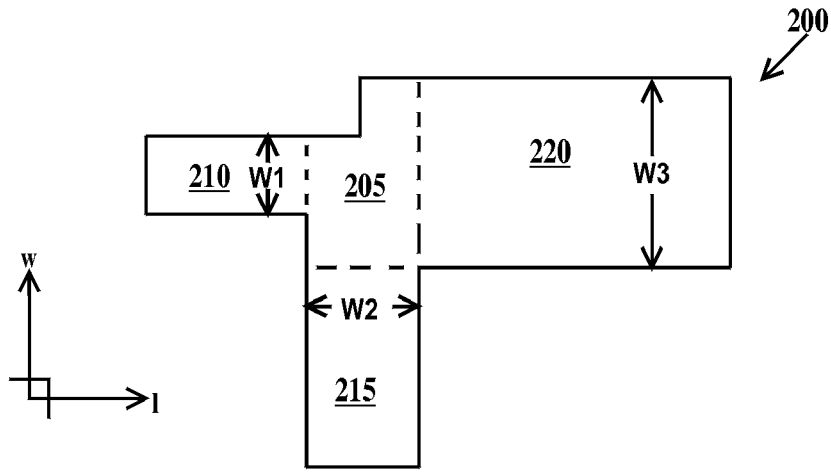
FIG. 3 is a layout view of a prior art T-junction.

FIG. 3 is a layout view of a prior art T-junction. In FIG. 3, a widthwise direction (w) is perpendicular to a lengthwise direction (l). Layout parameters are width and length. A T-junction 200 has an asymmetrical body 205 (having six sides and therefore six layout parameters), and first, second and third arms 210, 215 and 220 (each having two layout parameters). Arm 210, 215 and 220 have respective widths W1, W2 and W3. In the example of FIG. 3, W1<W2<W3. Generating a compact model of T-junction 200 is a very complex and time-consuming because of the lack of symmetry and the complex shape of body 205 and because of the unequal widths of arms 210, 215 and 220. Design kits for layout parasitics, resistance (R), inductance (L) and capacitance (C), do not include compact models for complex T-junctions such as T-junction 200, design-specific electromagnetic (EM) simulations must be run to generate compact parasitic models, i.e., models where R, inductance L and/or C are given as functions of shape lengths and widths. When T-junctions are used in high signal frequency transmission lines and waveguides comprising thin dielectric layers and closely spaced, narrow wires, capacitance in particular, is very important to model as capacitive coupling is a very likely mode of signal coupling. High signal frequencies are those between about 30 GHz and about 300 GHz.

Figure 4A:
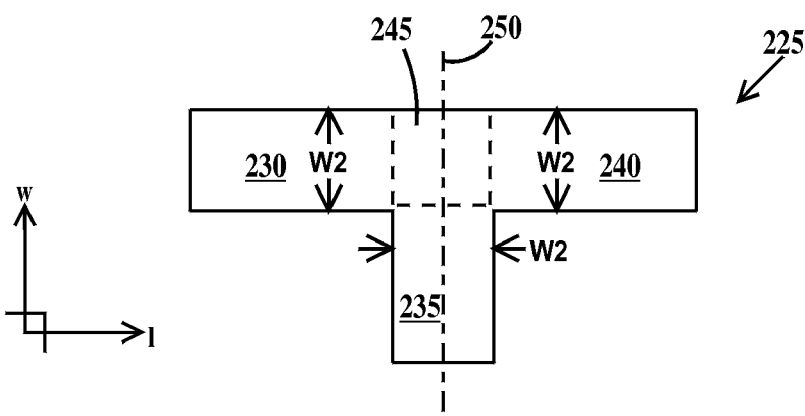
FIG. 4A is a layout view of a simple T-junction.

FIG. 4A is a layout view of a simple T-junction. In FIG. 4A, a symmetrical T-junction 225 include arms 230, 235 and 240 abutting a body 245. Arms 230, 240 and 245 all have a same width W2. T-junction 225 is symmetrical about and axis 250 passing through arm 245 (the middle arm) and body 245. Because of the equal width arms and symmetry, generating a compact model of T-junction 225 is much easier than generating a compact model of T-junction 200 of prior art FIG. 3. A first right-angle bend consists of body 245 and arms 235 and 240. A second right-angle bend consists of body 245 and arms 230 and 235. There are two right angle bends in a symmetrical T-junction. As will be discussed infra, a right-angle bend is used to model the lengths of the arms 230, 235 and 240.

Figure 4B:
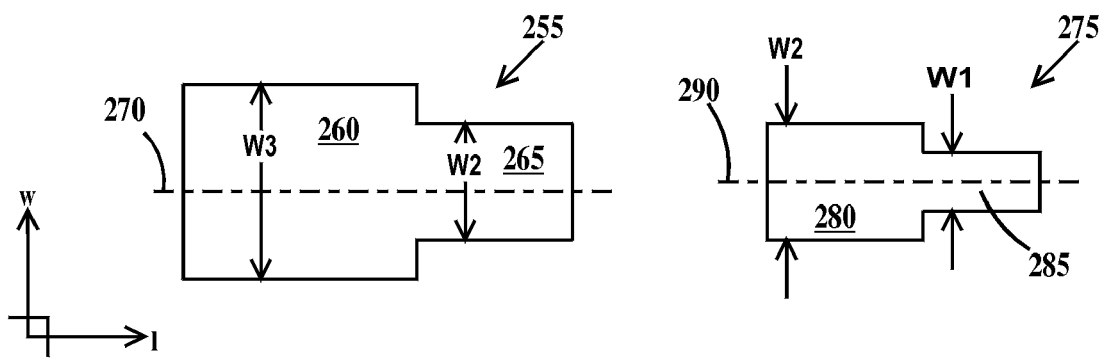
FIG. 4B is a layout view of a simple step-junction.

FIG. 4B is a layout view of two simple step-junctions. In FIG. 4B, a step-junction 255, consists of region 260 having width W3 and an abutting region 265 having width W2. Step-junction 255 is symmetrical about an axis 270. In FIG. 2B, a step-junction 275 consists of region 280 having width W2 and an abutting region 285 having width W1. A step-junction 275 is symmetrical about an axis 290.

In the example of FIGS. 3, 4A and 4B, W1<W2<W3. Embodiments of applicant's invention combine versions of T-junction 225 of FIG. 4A, step-junctions 255 and 275 of FIG. 4B to form a scalable T-connection illustrated in FIG. 5 and described infra.

FIG. 5 is a layout view of an exemplary T-connection according to the embodiments of the present invention. In FIG. 5, a T-connection 300 includes a step-junction 305 symmetrical about an axis 310 in the lengthwise direction, a T-junction 315, and a step-junction 325 symmetrical about axis 310. Step-junction 305 consists of a first section 330 having a uniform width W1 measured in the widthwise direction abutting a second and integral section 335 having a uniform width W2 measured in the widthwise direction. Step-junction 325 consists of a first section 335 having a uniform width W3 measured in the widthwise direction abutting a second integral section 340 having a uniform width W2 measured in the lengthwise direction. T-junction comprises integral arms 345 and 350 having uniform widths W2 measured in the widthwise direction and an integral arm 355 having a uniform width W2 measured in the widthwise direction and a square body 360 of dimensions W2 by W2. First arm 345 and third arm 350 of T-junction 315 have the same length L1 measured in the lengthwise direction. Second of arm 355 of T-junction 315 has length L1 measured in the widthwise direction. Length L1 should be kept as small as possible to minimize the layout area talen up by T-connection 300. T-junction 315 therefore has three arms of equal length and equal width. Arm 345 of T-junction 315 smoothly abuts section 335 of step-junction 305. Arm 350 of T-junction 315 smoothly abuts section 340 of step-junction 325. In a circuit layout, wires 365, 370 and 375 (of respective widths W1, W2 and W3) are placed smoothly abutting respectively to region 330 of step-junction 305, region 355 of T-junction 315, and region 325 of step-junction 325.

Depending upon how photomasks are to be generated and how the layout is compensated for mask fabrication processes variations, section 335 and arm 345 may overlap slightly, arm 350 and section 340 may overlap slightly, wire 365 and section 330 may overlap slightly, wire 370 and arm 355 may overlap slightly and wire 375 and section 335 may overlap slightly. Therefore the definition of smoothly abutting is intended to include "smoothly overlapping" where no regions of the overlapping sides (which would be two parallel lines in layout view) do not overlap. On a photomask, wires 365, 370 and 375, T-junction 315 and step-junctions 305 and 325 would comprise a single integral mask shape. On an integrated circuit, wires 365, 370 and 375, T-junction 315 and step-junctions 305 and 325 would comprise a single integral conductive element so top surfaces of the "individual" wires 365, 370 and 375, T-junction 315 and step-junctions 305 and 325 would be coplanar.

Dimensions of wires, of the sections of step-junctions and of the arms of T-junctions measured perpendicular to current flow are, by convention, called widths. Dimensions of wires, of the sections of step-junctions and of the arms of T-junctions measured parallel to current flow are, by convention, called lengths. In the Example of FIG. 5, current flow is in directions parallel to axes 310 and 320 (except in body 305). The two step-junctions are illustrated in FIG. 5, step-junction 305 with W1<W2 and step-junction 325 with W3>W2 represent any number of step-junctions that fulfill the requirements W1<W2 and W3>W2. For example, if W2=0.4 um, then there could be a step-junction with W1=0.1 um, another with W1=0.2 um, a third with W1=0.3 um, a fourth with W3=0.8 um, a fifth with W3=0.6 um and a sixth with W3=0.5 um. The matching T-junction would have arms widths W2.

The example of FIG. 5, illustrates a first possible combination of W1, W2 and W3 with two step-junctions where W1<W2<W3. A second possible combination of W1, W2 and W3 with two step-junctions is W1=W3, W3>W2. A third possible combination of W1, W2 and W3 with two step-junctions is W1=W3, W1<W2. A fourth possible combination of W1, W2 and W3 with two step-junctions is W1≠W3, W1>W2, W3>W2. A fifth possible combination of W1, W2 and W3 with two step-junctions is W1≠W3, W1<W2, W3<W2. A sixth possible combination of W1, W2 and W3 is W1=W2, W3.

T-connections according to embodiments of the present invention include combinations where there is only one step-junction. In a first example, step-junction 325 is not present and W1<W2, there is no W3. In a second example, step-junction 305 is not present and W3>W2, there is no W1.

Compact models for T-junction 315 and step-junctions 305 and 325 can be generated by using a field-solver and curve-fitting the results as described infra. Accordingly, a scalable T-connection compact model according to the embodiments of the present invention is a combination of a compact model of T-junction having only one variable parameter of width (W2) and one constant parameter of length (L1) and a step-junction compact model having two variables parameters of width (W1/W2 or W2/W3) and a constant parameter of the length of the section of the step-junctions. A single step-junction model can be used for multiple step-junctions. T-junction 315 is scalable because current flow behavior through the T-junction is relatively unaffected by the values of length L1 and width W2, while current flow through T-connection 200 of prior art FIG. 3 is significantly effected by the jogs of body 205.

Figure 6:
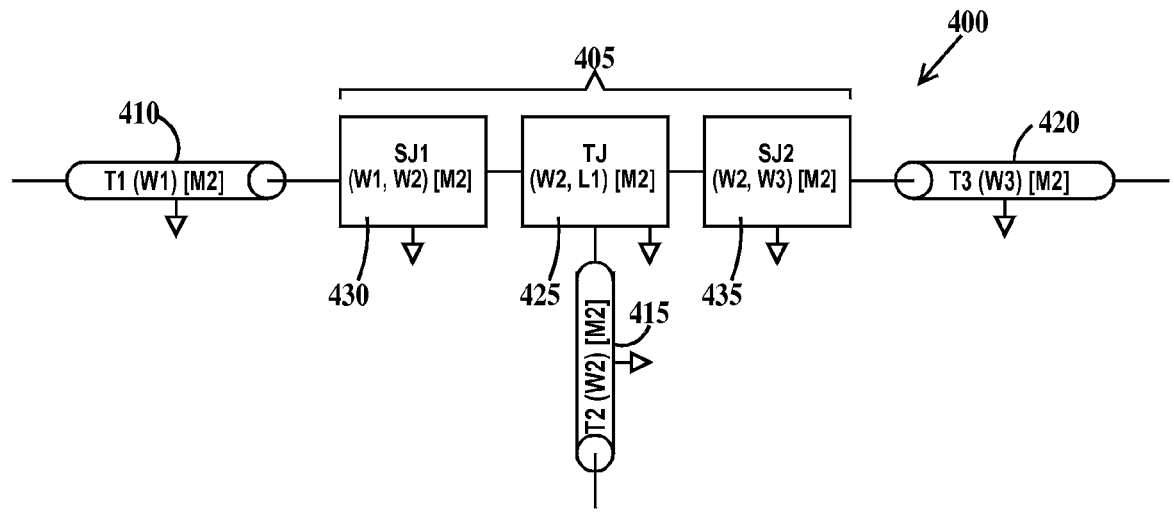
FIG. 6 is a schematic view of an exemplary circuit including a parameterized cell of a scalable T-junction according to embodiments of the present invention.

FIG. 6 is a schematic view of an exemplary circuit including a parameterized cell of a scalable T-junction according to embodiments of the present invention. In FIG. 6, a circuit 400 includes a PCell 405 (e.g., of T-connection 300 of FIG. 5), a first transmission line 410, a second transmission line 415 and a third transmission line 420. PCell 405 includes a T-junction 425 and first and second step-junctions 430 and 435. First step-junction 430 is connected to a first arm of T-junction 425 and second step-junction 435 is connected to a second arm of T-junction 425. First transmission line 410 is connected to first step-junction 430, second transmission line 415 is connected to a third arm of T-junction 425, and third transmission line 420 is connected to second step-junction 435. Continuing the example of FIG. 5, first transmission line 410 corresponds to wire 365 of FIG. 5, transmission line 415 corresponds to wire 370 of FIG. 5, and transmission line 420 corresponds to wire 375 of FIG. 5. T-junction 425, step-junctions 430 and 435, and transmission lines 410, 415 and 420 are labeled with a name, a parameter(s) in parentheses, and a wiring level in brackets. Transmission line 410 is labeled "T1", its parameter is width W1, and its wiring level is M2 (second wiring level). Transmission line 415 is labeled "T2", its parameter is width W2, and its wiring level is M2. Transmission line 420 is labeled "T3", its parameter is width W31, and its wiring level is M2. T-junction 425 is labeled "TJ", its parameters are width W2 and length L1, and its wiring level is M2. Step-junction 430 is labeled "SJ1", its parameters are widths W1, W2 and length L1, and its wiring level is M2. Step-junction 435 is labeled "SJ2", its parameters are widths W2, W3 and length L1, and its wiring level is M2.

PCell 405 is supported by compact parasitic models according to embodiments of the present invention as described infra. In one example, compact models are generated using a field solver and curve-fitting methods.

Figure 7:
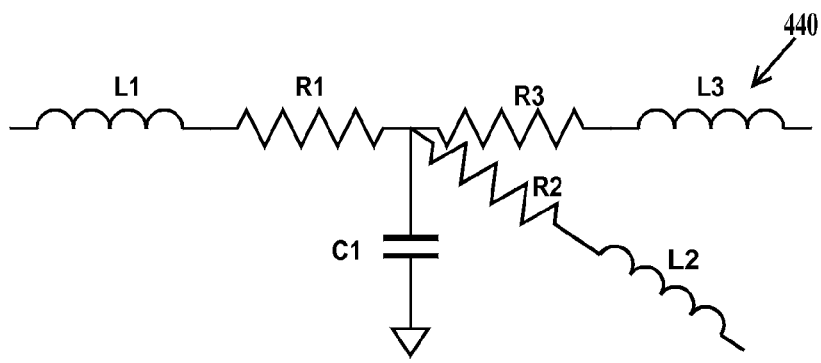
FIG. 7 is a parasitic RLC circuit model of a T-junction.

FIG. 7 is a parasitic RLC circuit model of a T-junction. The parasitic components of T-junction 425 of PCell 405 of FIG. 6 may be represented by a circuit 440 where inductor L1 and resistor R1 represent the first arm, inductor L2 and resistor R2 represent the second arm, inductor L3 and resistor R3 represent the third arm, and capacitor C1 represents the capacitance of T-junction 425.

Figure 8:
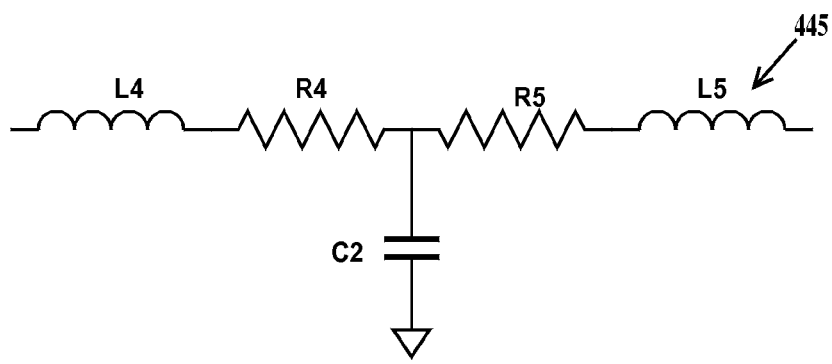
FIG. 8 is a parasitic RLC circuit model of a step-junction.

FIG. 8 is a parasitic RLC circuit model of a step-junction. The parasitic components of step-junction 410 of PCell 405 of FIG. 6 may be represented by a circuit 445 where inductor L4 and resistor R4 represent the W1 wide section, inductor L5 and resistor R5 represent the W2 section, and capacitor C2 represents the capacitance of step-junction 410. A circuit model for second step-junction 435 of PCell 405 of FIG. 6 is similar to circuit 445.

Figure 9:
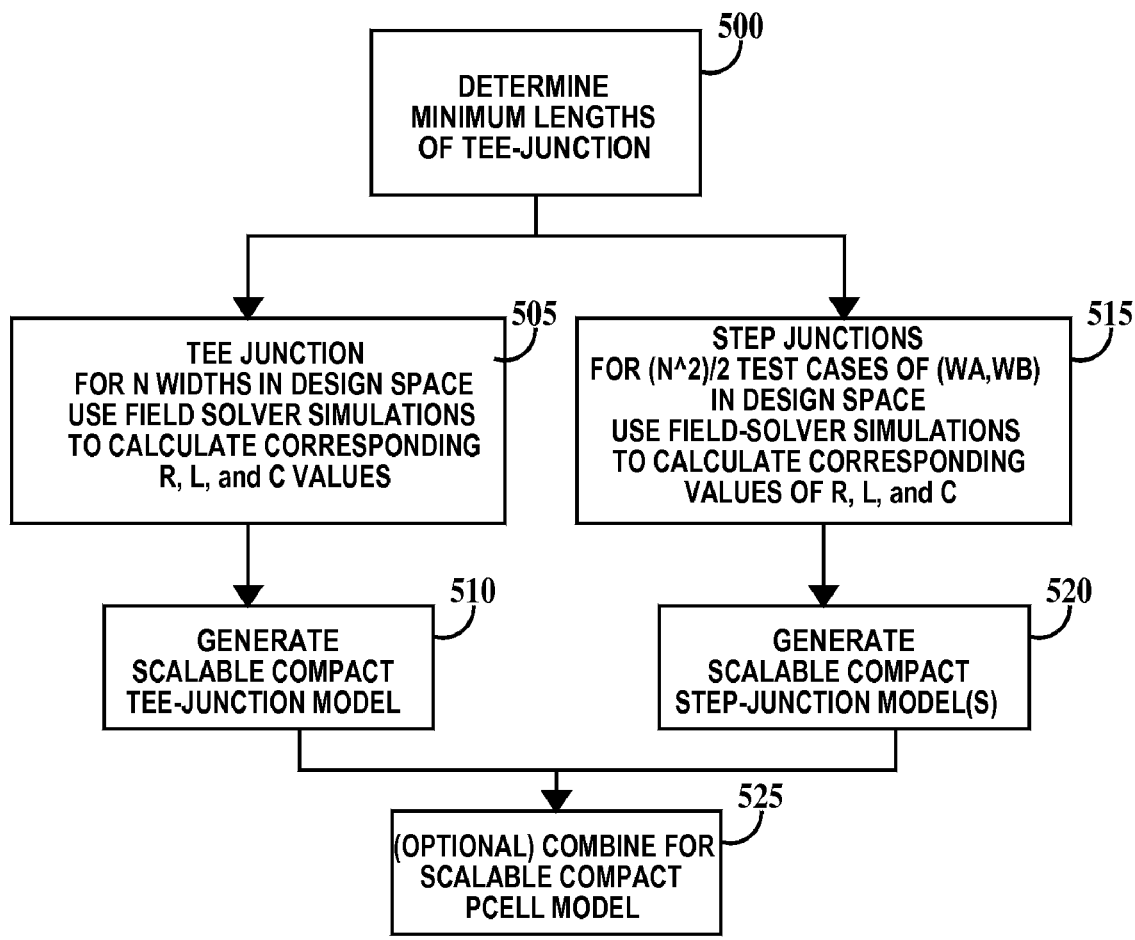
FIG. 9 is a flowchart of a method of generating a compact model for T-connections according to embodiments of the present invention.
Figure 10A:
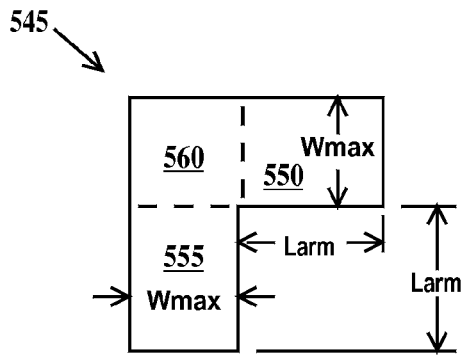
FIG. 10A is a layout view of a right-angle bend used to determine the minimum arm length of the T-junction of FIG. 5.
Figure 10B:
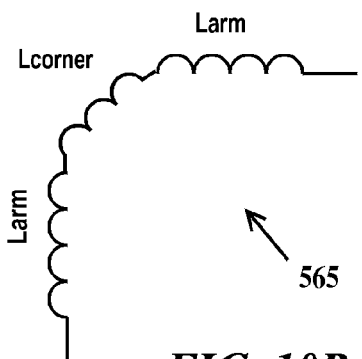
FIG. 10B is a parasitic inductance circuit model of right-angle bend 545 of FIG. 10A.
Figure 10C:
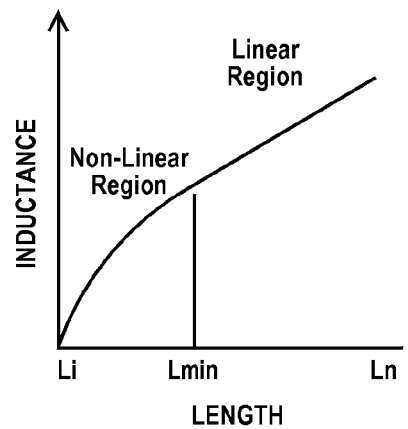
FIG. 10C is plot of inductance vs. arm length of right angle bend 545 of FIG. 10A.

FIG. 9 is a flowchart of a method of generating a compact model for scalable T-junctions according to embodiments of the present invention. Steps 500 through 525 are repeated for each wiring level of an integrated circuit in order to generate level specific compact models. In step 500, the minimum value of the lengths of the arms of a scalable T-junction are determined (e.g., lengths L1 of arms 345, 350 and 355 of T-junction 315 of FIG. 5). Determining the minimum arm length is illustrated in FIGS. 10A, 10B and 10C and described infra. The method next branches to either the sequence of steps 505 and 510 or to the sequence of steps 515 and 520.

In step 505, an electromagnetic field solver is used to calculate sets of values for R, inductance L and C for the RLC model of the T-junction (e.g., circuit 440 of FIG. 7). The field solver calculates values of $R_i$, $C_i$ and inductance $L_i$ corresponding to values of $W_i$ for i=1 to n and using the constant arm length L1 determined in step 500. The values of $W_i$ increase from $W_1$ to $W_n$ and should span a range of values from at least the minimum width of a wire for the current wiring level to the maximum width of wires for the current wiring level. It is advantageous that n be a relatively large number (e.g., about 100 or more). In step 510, the data obtained in step 515 can be used to generate a compact model (see FIGS. 11A, 11B and 11C and description infra.)

$$R=f(Warm), C=f(Warm), L=f(Warm) \quad (1)$$

where:
R is resistance,
C is capacitance,
L is inductance, and
Warm the width of the arms of the T-junction (W2 of FIG. 5).

In step 515, an electromagnetic field solver is used to generate sets of values for R, inductance L and C of an RLC model of the step-junction (e.g., circuit 445 of FIG. 8). This is accomplished using a fixed length for each section of the step-junction and using values of $WA_i$ and $WB_i$ talcen in combination to determine corresponding values of $R_i$, $C_i$ and inductance $L_i$, for i=1 to n, using a field solver. $WA_i$ are the widths of the section of the step-junction abutting the step-junction and $WB_i$ are the widths of the section of the step-junction away from the T-junction. In the example of FIG. 5, $WA_i$ is W2 and $WB_i$ is W1 or $WA_i$ is W2 and $WB_i$ is W3. The values of $WA_i$ and $WB_i$ increase from $W_1$ to $W_n$ and should span a range of values from at least the minimum width of a wire for the current wiring level to the maximum width of wires for the current wiring level. It is advantageous that n be a relatively large number (e.g., about 100 or more). In step 520, the data obtained in step 515 can be used to generate a compact model (see FIGS. 11A, 11B and 11C and description infra.) In step 515, the simulation data obtained in step 510 can be used to generate a compact model where:

$$R=f(WA, WB), C=f(WA, WB), L=f(WA, WB) \quad (2)$$

where:

R is resistance,

C is capacitance,

L is inductance,

WA the width of the arm of the step-junction abutting the T-junction (W2 of FIG. 5), and WB the width of the arm of the step-junction away from the T-junction (W1 or W3 of FIG. 5).

In optional step 525, a PCell compact model may be generated by combinations of the T-junction compact model equation set (1) and the step-junction compact model equation set (2).

FIG. 10A is a layout view of a right-angle bend used to determine the minimum arm length of the T-junction of FIG. 5. In FIG. 10A, a right-angle bend 545 consists of arms 550 and 550 extending perpendicular to each other from an integral square body 560. Arms 555 and 560 have a width Wmax and a length Larm. Body 560 is Wmax wide by Wmax long. Wmax is the widest width of a wire permitted by the groundrules for a given wiring level. Length Larm is a variable.

FIG. 10B is a parasitic inductance circuit model of right-angle bend 545 of FIG. 10A. The parasitic components of right-angle bend 545 of FIG. 10A may be represented by a circuit 565 where inductors Larm represent arms 555 and 550 of right-angle bend 545 of FIG. 10A and inductor Lcorner represents body 560 of right-angle bend 545 of FIG. 10A.

FIG. 10C is plot of inductance vs. arm length of right angle bend 545 of FIG. 10A. In FIG. 10C, inductance of right-angle bend 545 of FIG. 10A is plotted vs. the arm length Larm. An electromagnetic field solver is used to generate values for inductance of parasitic circuit model 565 of FIG. 10B. This is accomplished using Wmax and values of length Li determine corresponding values of inductance for lengths Larm=length Li for i=to n, using the field solver. The values of length Li increase from length $L_1$ to length Ln. In FIG. 10C, the curve of inductance vs. length has a non-linear region and a linear region. The value of length corresponding to the transition from non-linear to linear is length Lmin. Lmin is the arm length L1 of arms 345, 350 and 355 of T-junction 315 of T-connection 300 of FIG. 5.

Figure 11A:
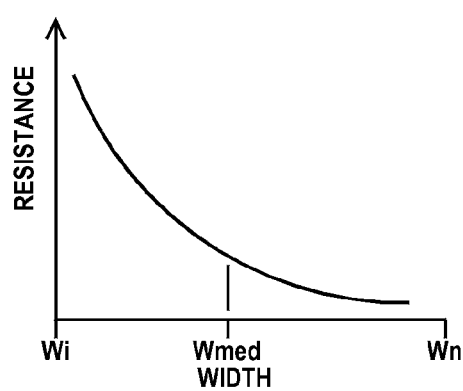
FIG. 11A is plot of resistance.
Figure 11B:
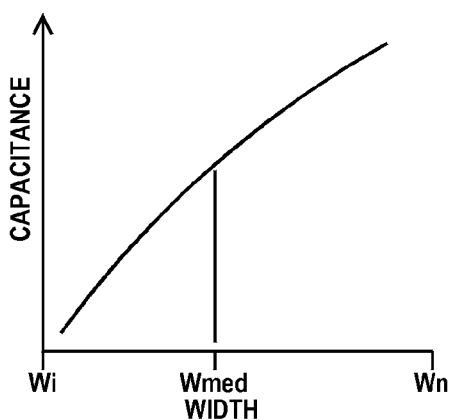
FIG. 11B is plot of capacitance and FIG. 11C is a plot of inductance vs. arm width of the T-junction from the field solver in step 505 of FIG. 9.
Figure 11C:
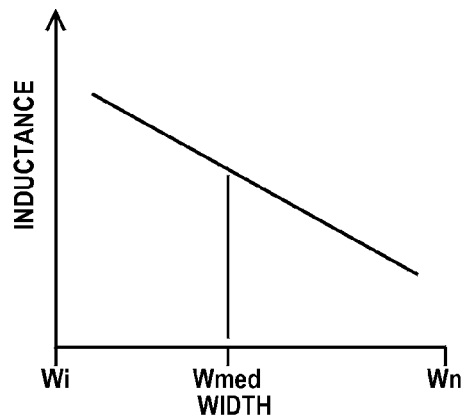

FIG. 11A is plot of resistance, FIG. 11B is plot of capacitance and FIG. 11C is a plot of inductance vs. arm width of the T-junction from the field solver in step 505 of FIG. 9. An arm width of Wmed is the arm width W2 of arms 345, 350 and 355 of T-junction 315 of T-connection 300 of FIG. 5. Curve-fitted equations of plots 11A, 11B and 11C are essentially compact models of a symmetrical T-junction according to embodiments of the present invention.

FIG. 12A is plot of resistance, FIG. 12B is plot of capacitance and FIG. 12C is a plot of inductance vs. the two widths of the two sections of the step-junction from the field solver in step 520 of FIG. 9. A value of WA is chosen based on the arm width of the T-junction the step-junction is "connected to." A value of WB is chosen based on the width of the wire the step-junction is connected to. These are the W2/W1 of step-junction 305 and W2/W3 of step-junction 325 of PCell 300 of FIG. 5. Given WA and WB, R, C and inductance L can be determined. Curve-fitted equations of plots 12A, 12B and 12C are essentially compact models of step-junctions according to embodiments of the present invention.

FIG. 13 is a flowchart of a design flow utilizing the scalable T-junction according to the embodiments of the present invention. In step 570, a wiring level of an integrated circuit is chosen and T-connection points identified. The wiring level includes all the wire routes. In step 575, for each T-connection point, the widths of the three wires are determined and a scalable PCell is scaled to match the wire widths of the wires to be connected and placed. In one example, the widths of the arms of the T-junction are scaled to be equal to the width of the median wire width of the three wires to be connected by the T-connection. The width of the arms Wmed of FIGS. 11A, 11B and 11C or W2 of FIG. 5 must be an allowable wire width (between the maximum and minimum wire widths permitted and an allowable multiple of the minimum wire width) and the width of one of the three wires being connected. In step 580, for each placed PCell, the values of R, C, and inductance L are determined using the compact models described supra. In step 585, the result of the compact models may optionally be outputted or displayed. In step 590, a design rule check (DRC) is run based on rules in a technology library 595 (or other performance analysis performed). Design rule checking is performed before integrated circuit manufacturing to ensure that in the placed and routed circuit design none of the rules of the target technology process is violated. Examples for such DRC are checks for shorts, spacing violations, unacceptable parasitic couplings and other design-rule problems between logic cells. An example for a software tool that does DRC is Dracula from Cadence Design Systems, Inc. in San Jose, Calif.

The goal of the design process is to output an integrated circuit design layout having T-connections between wires of one or more wiring levels of the integrated circuit. Further steps after step 590 include generating a complete wiring level design layout, generating a mask dataset from the wiring level design layout, fabricating a photomask from the photomask data set and fabricating an integrated circuit chip using the photomask.

Thus the embodiments of the present invention provide a more easily modeled T-junction, a scalable T-junction library element and methodology for designing T-junctions that mitigate the limitations and the deficiencies in the prior art described supra.

Generally, the method described herein with respect to a method of generating a compact model for scalable T-junctions and to method of design utilizing the scalable T-junction is practiced with a general-purpose computer and the methods described supra in the flow diagrams of FIGS. 9 and 13 may be coded as a set of instructions on removable or hard media for use by the general-purpose computer.

Figure 14:
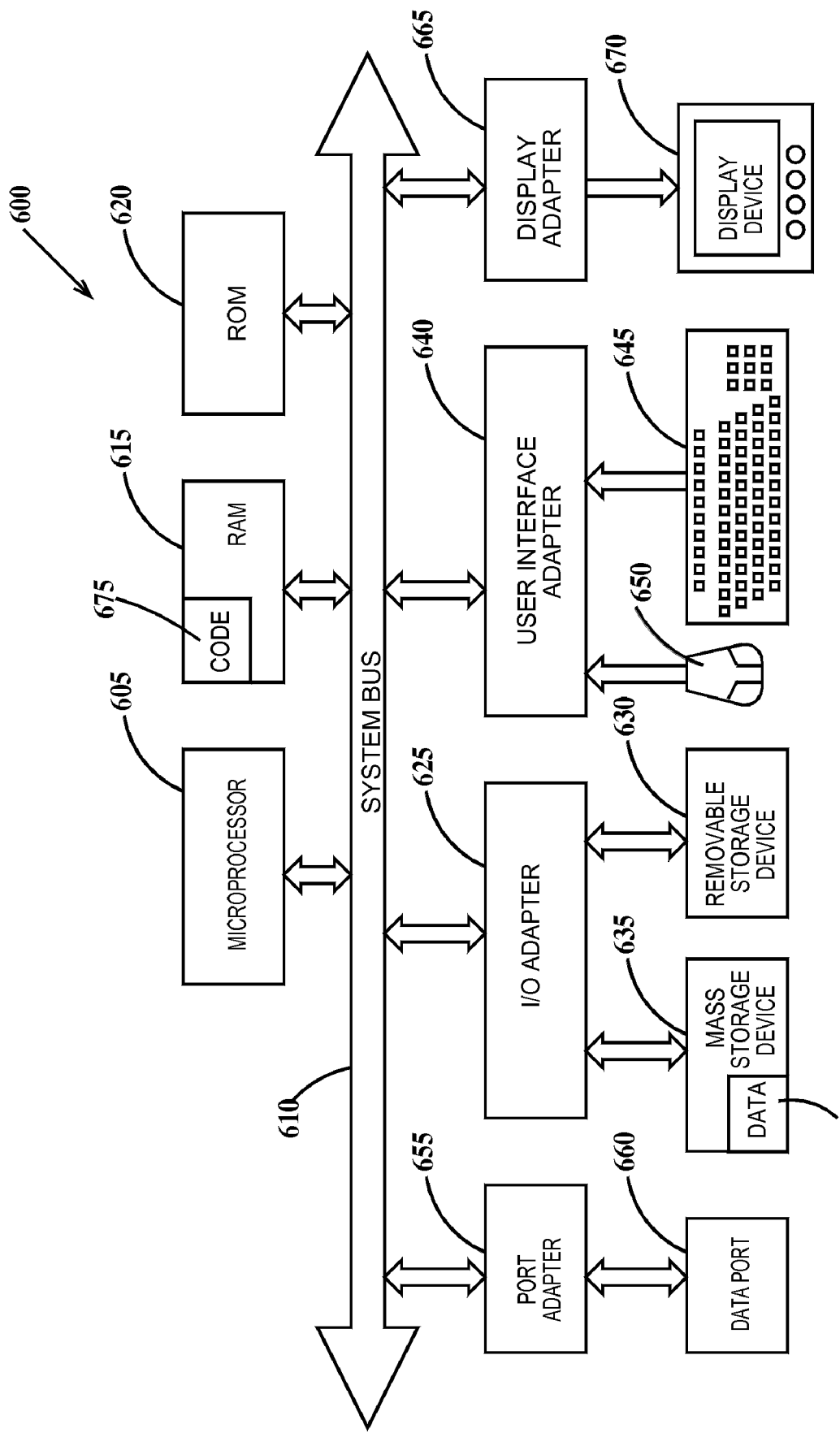
FIG. 14 is a schematic block diagram of a general-purpose computer.

FIG. 14 is a schematic block diagram of a general-purpose computer. In FIG. 14, computer system 600 has at least one microprocessor or central processing unit (CPU) 605. CPU 605 is interconnected via a system bus 610 to a random access memory (RAM) 615, a read-only memory (ROM) 620, an input/output (I/O) adapter 625 for a connecting a removable data and/or program storage device 630 and a mass data and/or program storage device 635, a user interface adapter 640 for connecting a keyboard 645 and a mouse 650, a port adapter 655 for connecting a data port 660 and a display adapter 665 for connecting a display device 670.

ROM 620 contains the basic operating system for computer system 600. The operating system may alternatively reside in RAM 615 or elsewhere as is known in the art. Examples of removable data and/or program storage device 630 include magnetic media such as floppy drives and tape drives and optical media such as CD ROM drives. Examples of mass data and/or program storage device 635 include electronic, magnetic, optical, electromagnetic, infrared, and semiconductor devices. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD- ROM), compact disk-read/write (CD-R/W) and DVD. In addition to keyboard 645 and mouse 650, other user input devices such as trackballs, writing tablets, pressure pads, microphones, light pens and position-sensing screen displays may be connected to user interface 640. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 630, fed through data port 660 or typed in using keyboard 645.

Thus, the embodiments of the present invention provide a method to a method of generating a compact model for scalable T-junctions and to method of design utilizing the scalable T-junction.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A T-connection, comprising:
   an electrically conductive damascene wire T-junction comprising a square body and first, second and third integral arms projecting in directions perpendicular to respective sides of said body, each arm of said three integral arms having first and second opposite sides and having a same physical first width that is the same as a length of a side of said body and having a same physical length extending away from said body, said first sides of each arm of said three integral arms coextensive with the side of said body that the arm projects from;
   an electrically conductive damascene wire step-junction comprising a first section having said first width and an integral and abutting second section having a second width, said second width different from said first width, a side of said first section integral and coextensive with said second side of said first arm of said T-junction; and
   wherein top surfaces of said T-junction and said step-junction are coplanar.

2. The T-connection of claim 1, wherein said first width of said first and second sides of said first arm of said T-junction and said side of said first section of said step-junction is greater than said second width of said second section of said step-junction.

3. The T-connection of claim 1, wherein said first width of said first and second sides of said first arm of said T-junction and said side of said first section of said step junction is less than said second width of said second section of said step junction.

4. The T-connection of claim 1, further including:
   an electrically conductive additional step-junction comprising a third section having said first width and an integral and abutting fourth section having a third width, said third width different from said second width, a side of said third section integral and coextensive with said second side of said second arm of said T-junction; and
   wherein a top surface of said additional step-junction is coplanar with said coplanar top surfaces of said T-junction and said step-junction.

5. The T-connection of claim 4, wherein said first width is greater than said second width and said first width is less than said third width.

6. The T-connection of claim 4, wherein said first width is equal to said third width and said first width is greater than said second width.

7. The T-connection of claim 4, wherein said first width is equal to said third width and said first width is less than said second width.

8. The T-connection of claim 4, wherein said second and third widths are less than said first width.

9. The T-connection of claim 4, wherein said second and third widths are greater than said first width.

10. The T-connection of claim 4, wherein said T-junction, said step-junction and said additional step-junction are contained in a wiring level of an integrated circuit chip, said third arm of said T-junction integral with and coextensive with an end of a first wire having said first width, said second section of said step-junction integral with and coextensive with an end of a second wire having said second width, and said fourth section of said additional step-junction integral with and coextensive with an end of a third wire having said third width.

11. A method of modeling a T-connection, comprising:
   inputting a layout of said T-connection consisting of a T-junction comprising:
      a square body having three integral arms, each arm of said three integral arms having first and second opposite sides and having a designed first width and a designed first length, said first width equal to a length of a side of said body, the first side of each arm of said three integral arms coextensive with the side of said body the arm projects from; and
      one or two step-junctions having respective first sections of said first width and respective second sections of respective second widths, said second widths different from each other, and a side of each first section coextensive with the second side of a respective arm of said three integral arms;
   calculating, using a first compact model of said T-junction running on a processor, two or more of parasitic resistance, parasitic inductance and parasitic capacitance of said T-junction based on said first length and said first width;
   calculating, using a second compact model of said one or two step-junctions running on said processor, two or more of parasitic resistance, parasitic inductance and parasitic capacitance of said step-junctions based on said first width and said second widths; and
   either outputting results of said first and second compact models or inputting said results of said first and second compact models to a performance analysis program.

12. The method of claim 11, wherein said performance analysis program is design rule checking.

13. The method of claim 11, wherein said first length is determined by:
   calculating, using an electromagnetic field solver running on said processors and operating on an RLC model of a corner-bend, a function of inductance versus length, based on a maximum wire width and a bend arm length; and
   selecting a length that marks a transition from a non-linear to a linear region of said function as said first length.

14. The method of claim 11, wherein said first compact model is generated using an electromagnetic field solver running on said processor and operating on an RLC model of said T-junction.

15. The method of claim 11, wherein said second compact model is generated using an electromagnetic field solver running on said processor and operating on an RLC model of said one or two step-junctions.

16. A method of designing an integrated circuit, comprising:
   (a) selecting a wiring layer of an integrated circuit;
   (b) selecting, using a processor of a computer, a set of three wires to connect using a T-connection PCell having a T-junction and one or two step-junctions, at least two of said wires having different widths, said T-connection PCell comprising:
      said T-junction having a square body having three integral arms, each arm of said three integral arms having first and second opposite sides and having of a designed first width and a designed first length, said first width equal to a length of a side of said body, the first side of each arm of said three integral arms coextensive with the side of said body the arm projects from;
      said one or two step-junctions having respective first sections of said first width and respective second sections of respective second widths, said second widths different from each other, and a side of each first section coextensive with the second side of a respective arm of said three integral arms; and
      wherein parameters of said T-connection PCell include said designed first width, said designed first length and said respective second widths;
   (c) selecting, using said processor, said first width to be a width of a first wire of said three wires and selecting said second section widths to be equal to widths of respective second and third wires of said three wires;
   (d) placing, using said processor, said T-connection PCell on a layout of said wiring level to interconnect said three wires; and
   (e) outputting said layout.

17. The method of claim 16, wherein, when there are two step-junctions, said first width is greater than a width of a second section of a first step junction of said one or two step-junctions and less than a width of a second section of a second step-junction of said one or two step junctions.

18. The method of claim 16, further including:
   calculating, using a first compact model of said T-junction running on said processor, two or more of parasitic resistance, parasitic inductance and parasitic capacitance of said T-junction based on said first length and said first width; and
   calculating, using a second compact model of said one or two step-junctions running on said processor, two or more of parasitic resistance, parasitic inductance and parasitic capacitance of said step-junctions based on said first width and said section widths.

19. The method of claim 16, further including:
   repeating (b) through (d) for each set of three wires having at least two wires of different widths.

20. The method of claim 16, further including:
   repeating (a) through (d) for each wiring level of said integrated circuit.

21. A computer system comprising a processor, an address/data bus coupled to said processor, and a computer-readable memory unit coupled to communicate with said processor, said memory unit containing instructions that when executed by the processor implement a method for designing an integrated circuit, said method comprising the computer implemented steps of:
   (a) selecting a wiring layer of an integrated circuit;
   (b) selecting, using a processor of a computer, a set of three wires to connect using a T-connection PCell having a T-junction and one or two step-junctions, at least two of said wires having different widths, said T-connection PCell comprising:
      said T-junction having a square body having three integral arms, each arm of said three integral arms having first and second opposite sides and having of a designed first width and a designed first length, said first width equal to a length of a side of said body, the first side of each arm of said three integral arms coextensive with the side of said body the arm projects from;
      said one or two step-junctions having respective first sections of said first width and respective second sections of respective second widths, said second widths different from each other, and a side of each first section coextensive with the second side of a respective arm of said three integral arms; and
      wherein parameters of said T-connection PCell include said designed first width, said designed first length and said respective second widths;
   (c) selecting said first width to be a width of a first wire of said three wires and selecting said second section widths to be equal to widths of respective second and third wires of said three wires;
   (d) placing said T-connection PCell on a layout of said wiring level to interconnect said three wires; and
   (e) outputting said layout.

22. The system of claim 21, wherein, when there are two step-junctions, said first width is greater than a width of a second section of a first step junction of said one or two step-junctions and less than a width of a second section of a second step-junction of said one or two step-junctions.

23. The system of claim 21, the method further including the step of:
   calculating, using a first compact model of said T-junction running on said processor, two or more of parasitic resistance, parasitic inductance and parasitic capacitance of said T-junction based on said first length and said first width; and
   calculating, using a second compact model of said one or two step-junctions running on said processor, two or more of parasitic resistance, parasitic inductance and parasitic capacitance of said step-junctions based on said first width and said section widths.

24. The system of claim 21, the method further including the step of:
   repeating (b) through (d) for each set of three wires having at least two wires of different widths.

25. The system of claim 21, the method further including the step of:
   repeating (a) through (d) for each wiring level of said integrated circuit.

* * * * *